(12) United States Patent
Chiang et al.

(10) Patent No.: US 11,911,871 B2
(45) Date of Patent: Feb. 27, 2024

(54) METHOD OF MANUFACTURING COMPOSITE ARTICLE

(71) Applicant: TAIWAN SEMICONDUCTOR MANUFACTURING COMPANY LTD., Hsinchu (TW)

(72) Inventors: Hua-Chou Chiang, Hsinchu County (TW); Chandler Ying Lai See, Hsinchu (TW); Chung-Chieh Ko, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1333 days.

(21) Appl. No.: 16/285,605

(22) Filed: Feb. 26, 2019

(65) Prior Publication Data

US 2020/0130137 A1    Apr. 30, 2020

Related U.S. Application Data

(60) Provisional application No. 62/753,302, filed on Oct. 31, 2018.

(51) Int. Cl.
| | |
|---|---|
| *B24B 53/017* | (2012.01) |
| *B24B 37/04* | (2012.01) |
| *B27N 3/00* | (2006.01) |
| *H01L 21/304* | (2006.01) |
| *H01L 21/321* | (2006.01) |
| *H01L 21/67* | (2006.01) |

(52) U.S. Cl.
CPC ............ *B24B 53/017* (2013.01); *B24B 37/04* (2013.01); *B27N 3/007* (2013.01); *H01L 21/304* (2013.01); *H01L 21/3212* (2013.01); *H01L 21/67* (2013.01)

(58) Field of Classification Search
None
See application file for complete search history.

(56) References Cited

U.S. PATENT DOCUMENTS

| | | | | |
|---|---|---|---|---|
| 2,779,465 | A | * | 1/1957 | Orval .................. A47L 1/15 206/229 |
| 9,616,551 | B2 | * | 4/2017 | Meana-Esteban ....... B24D 3/28 |
| 2002/0077037 | A1 | * | 6/2002 | Tietz .................... B24D 3/34 451/41 |
| 2008/0171503 | A1 | * | 7/2008 | Sung ................... B24B 53/12 451/540 |
| 2020/0130137 | A1 | * | 4/2020 | Chiang ............... H01L 21/3212 |

FOREIGN PATENT DOCUMENTS

| | | | | | |
|---|---|---|---|---|---|
| CN | | 202357029 U | * | 8/2012 | |
| CN | | 108714851 A | * | 10/2018 | ............. B24B 31/02 |

* cited by examiner

*Primary Examiner* — Sylvia MacArthur
(74) *Attorney, Agent, or Firm* — WPAT LAW; Anthony King

(57) ABSTRACT

A method of manufacturing a composite article includes providing a polishing pad; rubbing over the polishing pad to produce a polishing pad debris; collecting the polishing pad debris; providing a wood material; and applying a force over the wood material and the polishing pad debris to form the composite article, wherein the composite article includes the wood material and the polishing pad debris, and the rubbing of the polishing pad includes removing a portion of the polishing pad to produce the polishing pad debris.

7 Claims, 6 Drawing Sheets

METHOD OF MANUFACTURING COMPOSITE ARTICLE

PRIORITY CLAIM AND CROSS-REFERENCE

This application claims the benefit of a provisional application Ser. No. 62/753,302 filed on Oct. 31, 2018, entitled "Method of Manufacturing Composite Article", the disclosure of which is hereby incorporated by reference in its entirety.

BACKGROUND

With the advancement of electronic technology, the semiconductor device is becoming increasingly smaller in size while having greater functionality and greater amounts of integrated circuitry. Due to the miniaturized scale of the semiconductor device, numerous semiconductor components and manufacturing operations are involved.

Some of the semiconductor components of the semiconductor device are formed by deposition and etching operations. For example, a conductive via is formed by disposing conductive material into an opening of a substrate and then removing some portions of the conductive material over a surface of the substrate. As such, certain amount of materials is removed and then thrown away. However, disposal of those materials would lead to environmental issue or result in wastage. Therefore, subsequent processing of those removed materials is necessary in order to reduce disposal and wastage of the materials, while such subsequent processing of those removed materials may encounter challenges.

As such, there is a continuous need to modify and improve manufacturing and processing of components of the semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
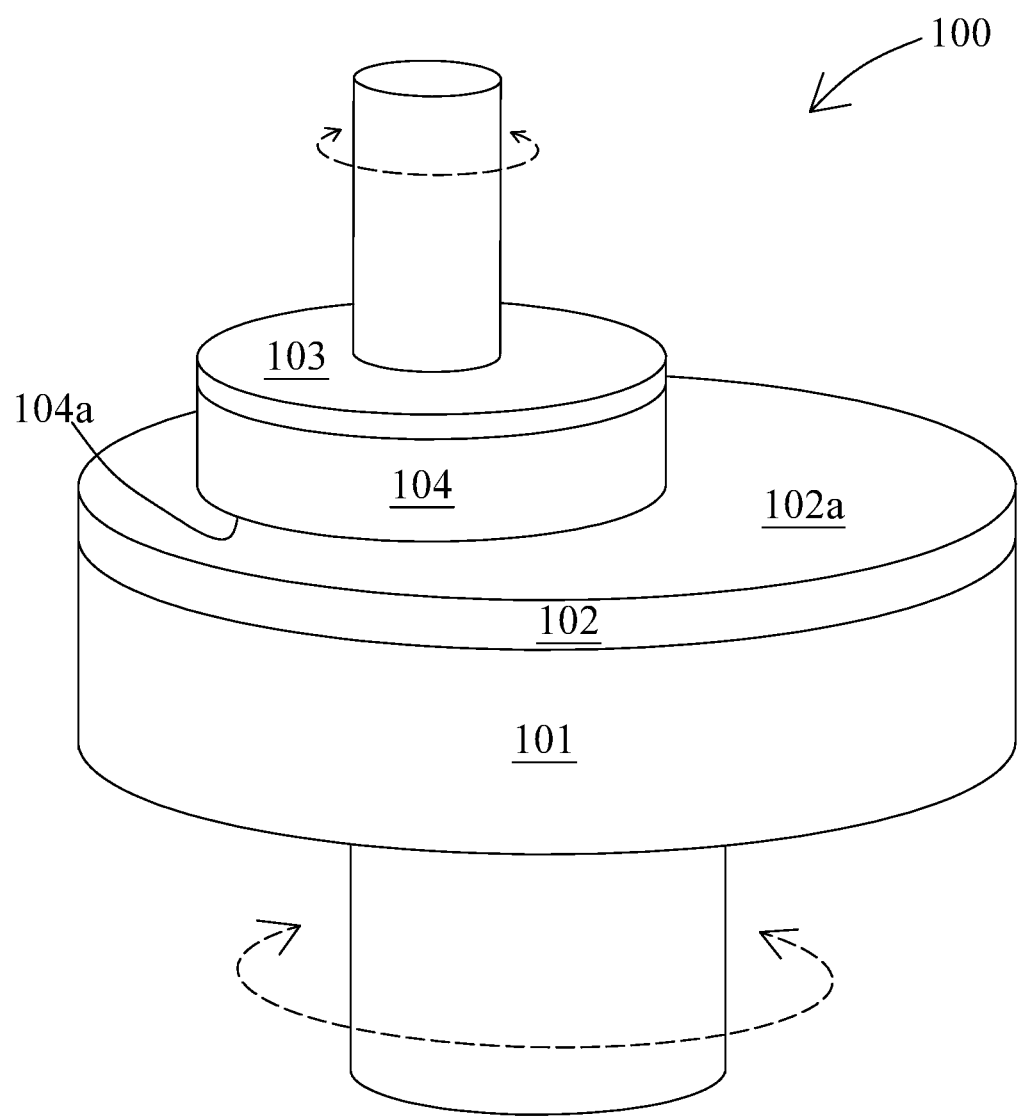
FIG. 1 is a schematic isometric view of an apparatus configured to perform polishing operations for a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. Upon the manufacturing of the semiconductor structure, a wafer or substrate is provided, and several conductive lines and several electrical components connected by the conductive lines are formed over the substrate. Some of electrical components of the semiconductor structure are formed by disposing a material over the substrate and then removing excessive material from the substrate. As such, chemical mechanical planarization (CMP) is performed to remove the excessive material and planarize the semiconductor structure. Further, CMP is performed to polish a surface of the semiconductor structure in order to prepare for subsequent material deposition over the substrate. Upon CMP, the semiconductor structure is rubbed by a polishing pad with a rough surface, and thus some of the polishing pads are peeled off from the polishing pad to become polishing pad debris. The polishing pad debris is then thrown away. However, such disposal of the polishing pad debris may lead to environmental problems or material wastage.

In the present disclosure, a method of manufacturing a composite article is disclosed. The method includes providing a polishing pad; rubbing over the polishing pad to produce a polishing pad debris; collecting the polishing pad debris; providing a wood material; and applying a force over the wood material and the polishing pad debris to form the composite article. The composite article includes the wood material and the polishing pad debris, and the rubbing of the polishing pad includes removing a portion of the polishing pad to produce the polishing pad debris. The polishing pad debris is combined with the wood material to become the composite article, and the composite article is assembled with several wooden bars to become a pallet. As such, the polishing pad debris is recycled or reused. Therefore, the disposal of the polishing pad debris can be reduced or avoided.

FIG. 1 is a schematic view of an apparatus 100 in accordance with various embodiments of the present disclosure. In some embodiments, the apparatus 100 includes a stage 101, a polishing pad 102 and a holder 103. In some embodiments, the apparatus 100 is configured to perform polishing operations for a semiconductor structure 104. In some embodiments, the apparatus 100 is configured to perform CMP operations. In some embodiments, the CMP operations use a combination of chemical reactions and mechanical grinding to remove material from a surface of the semiconductor structure 104.

In some embodiments, the stage 101 is configured to hold and support the polishing pad 102. In some embodiments, the stage 101 is rotatable about a center of the stage 101. In some embodiments, the stage 101 can be rotated in clockwise or anti-clockwise direction. In some embodiments, the stage 101 is rotatable relative to the holder 103 and the semiconductor structure 104. In some embodiments, the stage 101 is rotated in a constant or variable rotational speed.

In some embodiments, the stage 101 is rotated by a motor such as alternating current (AC) motor, a direct current (DC) motor, a universal motor, or any other suitable motors. In some embodiments, the stage 101 and the polishing pad 102 are in the same rotational speed. In some embodiments, the rotation of the stage 101 and the rotations of the polishing pad 102 are synchronous. In some embodiments, the stage 101 is in a circular shape. In some embodiments, the stage 101 is a platen.

In some embodiments, the polishing pad 102 is disposed over the stage 101. In some embodiments, the polishing pad 102 is mounted or fixed over the stage 101. In some embodiments, the polishing pad 102 is temporarily attached to the stage 101 upon the polishing operations. In some embodiments, the polishing pad 102 is removable from the stage 101. In some embodiments, the polishing pad 102 is in a circular shape. In some embodiments, a width of the polishing pad 102 is substantially the same as a width of the stage 101. In some embodiments, the polishing pad 102 is a porous structure. In some embodiments, the polishing pad 102 includes polyurethane (PU).

In some embodiments, the polishing pad 102 is rotatable about a center of the polishing pad 102. In some embodiments, the polishing pad 102 can be rotated in clockwise or anti-clockwise direction. In some embodiments, the polishing pad 102 is rotatable relative to the holder 103 and the semiconductor structure 104. In some embodiments, the polishing pad 102 is rotated in a constant or variable rotational speed. In some embodiments, the polishing pad 102 is rotated by the stage 101.

In some embodiments, the polishing pad 102 includes a rough surface 102a configured for polishing the semiconductor structure 104. In some embodiments, the polishing pad 102 includes several protrusions protruded from the rough surface 102a thereof. In some embodiments, the rough surface 102a of the polishing pad 102 is in contact with a surface of the semiconductor structure 104 upon the polishing operations. In some embodiments, some portions of the polishing pad 102 are peeled off from the polishing pad 102 to become polishing pad debris upon the polishing operations.

In some embodiments, the holder 103 is disposed above the polishing pad 102. In some embodiments, the holder 103 is configured to hold the semiconductor structure 104. In some embodiments, the semiconductor structure 104 is mounted over the holder 103. In some embodiments, the semiconductor structure 104 is temporarily attached to the holder 103 upon the polishing operations. In some embodiment, the semiconductor structure 104 is removable from the holder 103. In some embodiments, the holder 103 is in a circular shape. In some embodiments, the holder 103 is a wafer carrier or a substrate carrier.

In some embodiments, the holder 103 is rotatable about a center of the holder 103. In some embodiments, the holder 103 can be rotated in clockwise or anti-clockwise direction. In some embodiments, the holder 103 is rotatable relative to the polishing pad 102 and the stage 101. In some embodiments, the holder 103 is rotated in a constant or variable rotational speed. In some embodiments, the holder 103 is rotated by a motor such as alternating current (AC) motor, a direct current (DC) motor, a universal motor, or any other suitable motors.

In some embodiments, the holder 103 and the semiconductor structure 104 are in the same rotational speed. In some embodiments, the rotation of the holder 103 and the rotations of the semiconductor structure 104 are synchronous. In some embodiments, the holder 103 and the polishing pad 102 are counter-rotated upon the polishing operations.

In some embodiments, the semiconductor structure 104 is held by the holder 103. In some embodiments, the semiconductor structure 104 is rotatable about a center of the semiconductor structure 104. In some embodiments, the semiconductor structure 104 can be rotated in clockwise or anti-clockwise direction. In some embodiments, the semiconductor structure 104 is rotatable relative to the polishing pad 102 and the stage 101. In some embodiments, the semiconductor structure 104 is rotated in a constant or variable rotational speed. In some embodiments, the semiconductor structure 104 is rotated by the holder 103. In some embodiments, the semiconductor structure 104 is in a circular shape.

In some embodiments, the semiconductor structure 104 is a wafer or a substrate. In some embodiments, the semiconductor structure 104 is a silicon wafer or a silicon substrate. In some embodiments, the semiconductor structure 104 includes semiconductive material such as silicon, germanium or the like. In some embodiments, the semiconductor structure 104 includes a circuitry thereover. In some embodiments, the semiconductor structure 104 includes electrical components and conductive lines connecting the electrical components.

In some embodiments, the semiconductor structure 104 includes a surface 104a facing to the rough surface 102a of the polishing pad 102. In some embodiments, the surface 104a of the semiconductor structure 104 is in contact with the rough surface 102a of the polishing pad 102 upon the polishing operations. In some embodiments, the semiconductor structure 104 is ground by the polishing pad 102 upon the polishing operations. In some embodiments, the semiconductor structure 104 and the polishing pad 102 are counter-rotated upon the polishing operations.

Figure 2:
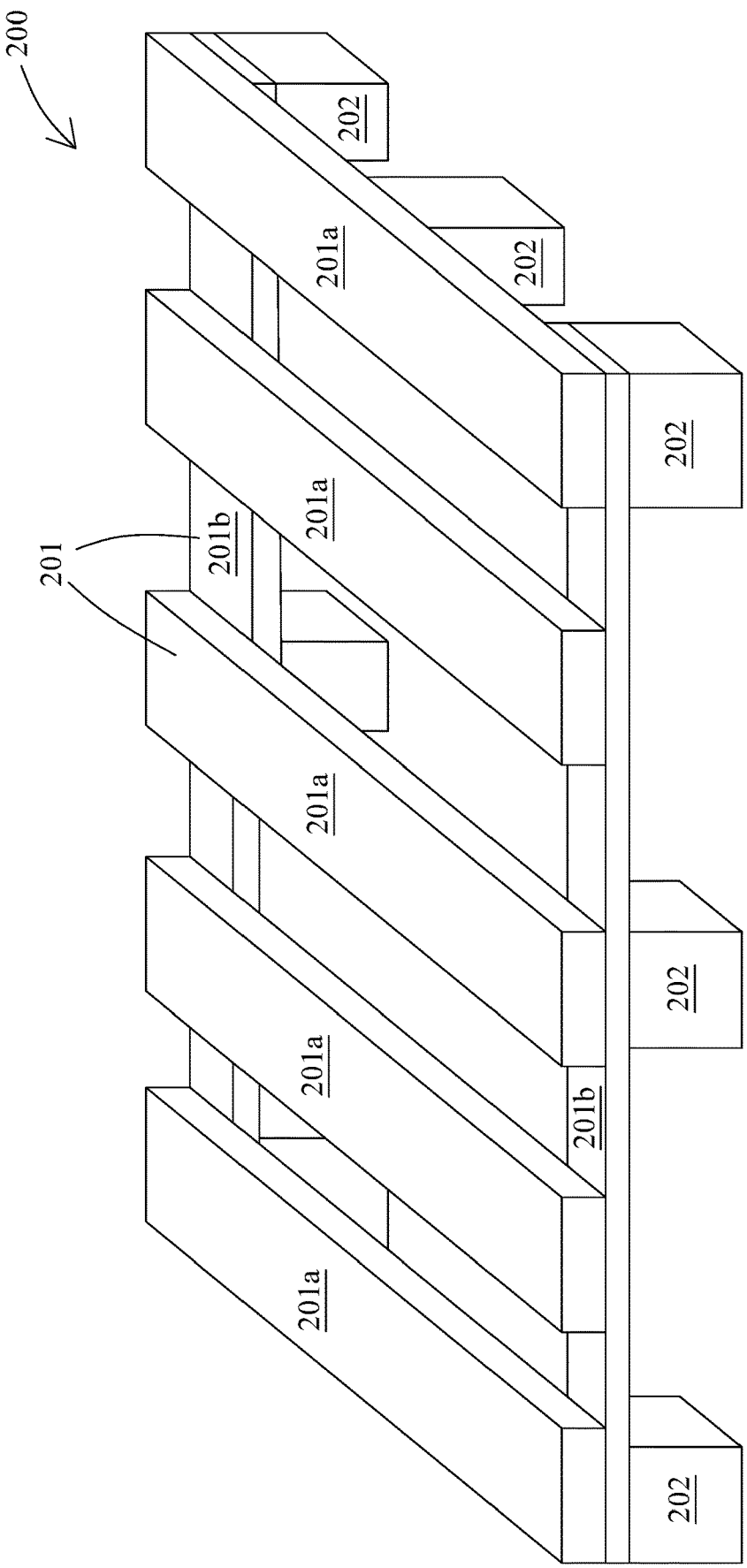
FIG. 2 is a schematic isometric view of a conveying structure including a composite article in accordance with some embodiments of the present disclosure.

FIG. 2 is a schematic view of a conveying structure 200 in accordance with various embodiments of the present disclosure. In some embodiments, the conveying structure 200 includes several bars 201 and several supporting blocks 202 under the bars 201. In some embodiments, the conveying structure 200 is configured to carrying and transporting a container or a box holding goods. In some embodiments, the conveying structure 200 together with the container holding goods can be lifted and moved by a loader.

In some embodiments, the bars 201 are arranged to support a container, a box, goods or the like. In some embodiments, the bars 201 include wood or any other suitable material. In some embodiments, the bars 201 include first bars 201a and second bars 201b substantially orthogonal to the first bars 201a. In some embodiments, the first bars 201a are arranged substantially in parallel to each other. In some embodiments, the first bars 201a are spaced from each other in a distance. In some embodiments, the first bars 201a are spaced from each other in a constant distance. In some embodiments, the second bars 201b are disposed at ends of one of the first bars 201a. In some embodiments, the second bars 201b are disposed at an edge of the conveying structure 200.

In some embodiments, the supporting blocks 202 are disposed at ends of the bars 201. In some embodiments, the supporting block 202 is disposed at a corner of the conveying structure 200. In some embodiments, the supporting blocks 202 are disposed under the bars 201. In some embodiments, the supporting block 202 is attached to an end of the bars 201 or a corner of the conveying structure 200. In some embodiments, the supporting blocks 202 are protruded downwardly from the bars 201.

In some embodiments, the supporting blocks 202 are a composite article. In some embodiments, the supporting blocks 202 include recycled material. In some embodiments, the supporting blocks 202 include the polishing pad debris produced upon the polishing operations. In some embodiments, the supporting blocks 202 include polyurethane (PU). In some embodiments, the supporting blocks 202 include PU recycled from the polishing pad debris. In some embodiments, the supporting blocks 202 include wood material and PU. In some embodiments, a first content of the polishing pad debris in the supporting blocks 202 is substantially less than a second content of wood material in the supporting blocks 202. In some embodiments, a ratio of the first content to the second content is about 3:7. In some embodiments, the supporting blocks 202 are formed by compressing the polishing pad debris and wood material. In some embodiments, the supporting blocks 202 are in a block or cube configuration.

Figure 3:
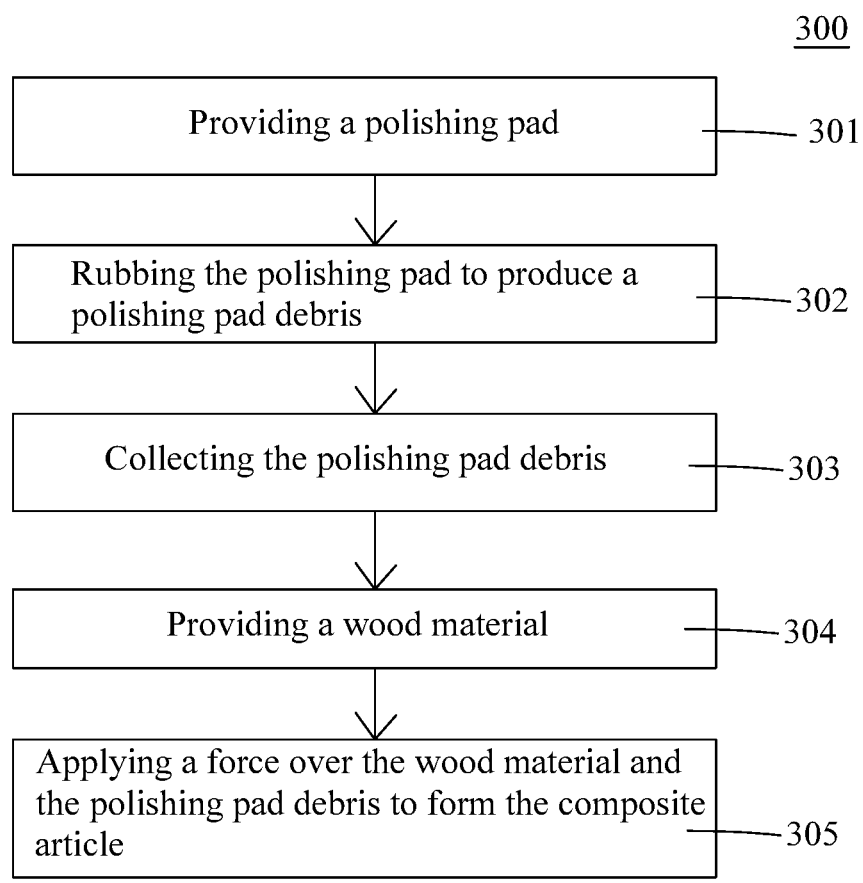
FIG. 3 is a flow diagram of a method of manufacturing a composite article in accordance with some embodiments of the present disclosure.

In the present disclosure, a method of manufacturing a composite article is disclosed. In some embodiments, the composite article is manufactured by method 300. The method 300 includes a number of operations and the description and illustration are not deemed as a limitation as the sequence of the operations. FIG. 3 is an embodiment of the method 300 of manufacturing the composite article. The method 300 includes a number of operations (301, 302, 303, 304 and 305).

Figure 4:
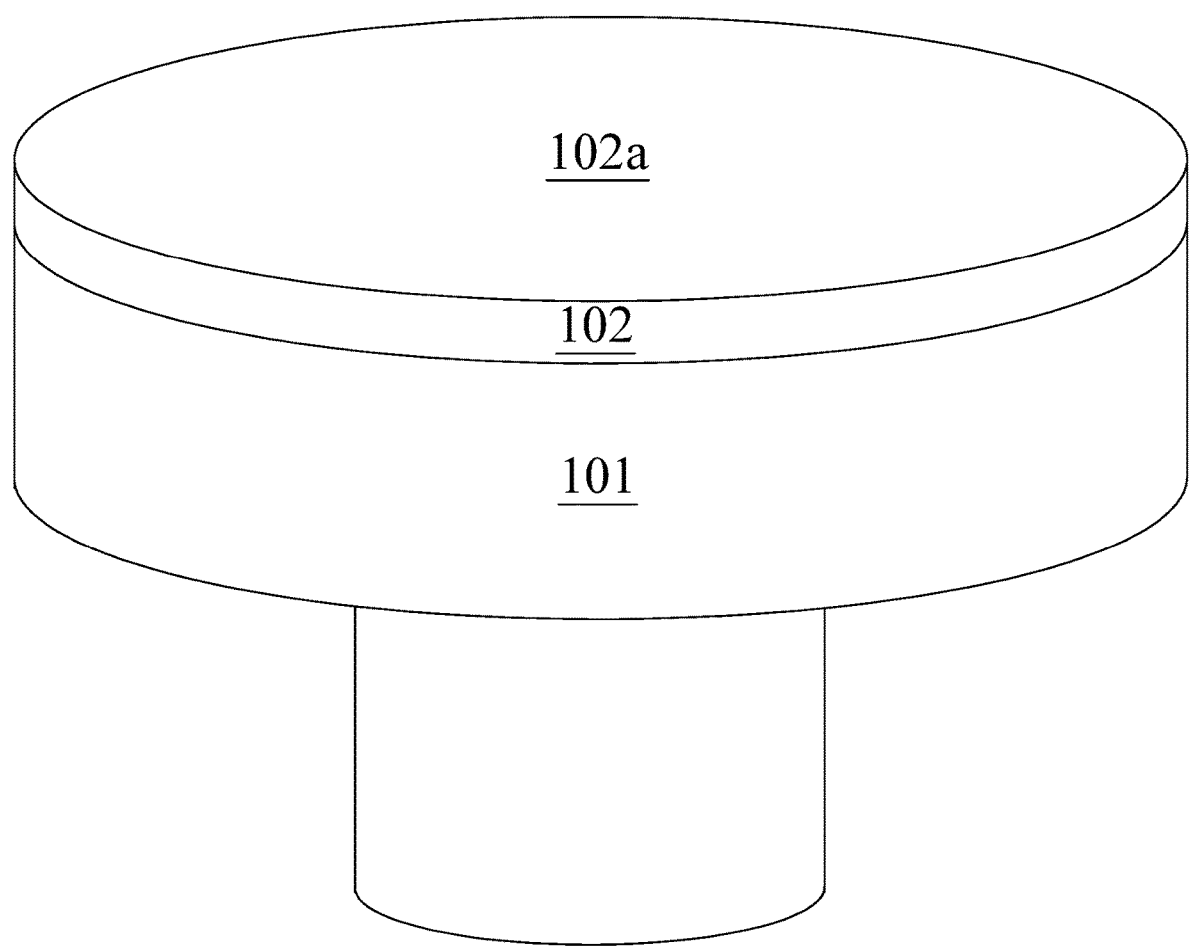
FIGS. 4-6 are schematic isometric views of manufacturing a composite article by a method of FIG. 3 in accordance with some embodiments of the present disclosure.

In operation 301, a polishing pad 102 is provided as shown in FIG. 4. In some embodiments, the polishing pad 102 is disposed over and supported by a stage 101. In some embodiments, the polishing pad 102 is mounted or fixed over the stage 101. In some embodiments, the polishing pad 102 is temporarily attached to the stage 101 upon the polishing operations. In some embodiments, the polishing pad 102 is removable from the stage 101.

In some embodiments, the polishing pad 102 is rotatable about a center of the polishing pad 102. In some embodiments, the polishing pad 102 can be rotated in clockwise or anti-clockwise direction. In some embodiments, the polishing pad 102 is rotated by the stage 101. In some embodiments, the stage 101 is rotatable about a center of the stage 101. In some embodiments, the stage 101 can be rotated in clockwise or anti-clockwise direction. In some embodiments, the stage 101 is rotated by a motor. In some embodiments, the stage 101 is a platen.

In some embodiments, the polishing pad 102 includes a rough surface 102a configured for polishing a semiconductor structure. In some embodiments, the rough surface 102a is roughened by formation of protrusions over the polishing pad 102. In some embodiments, the protrusions are protruded from the rough surface 102a of the polishing pad 102. In some embodiments, the polishing pad 102 includes polyurethane (PU). In some embodiments, the stage 101 and the polishing pad 102 are in configurations as described above or shown in FIG. 1.

Figure 5:
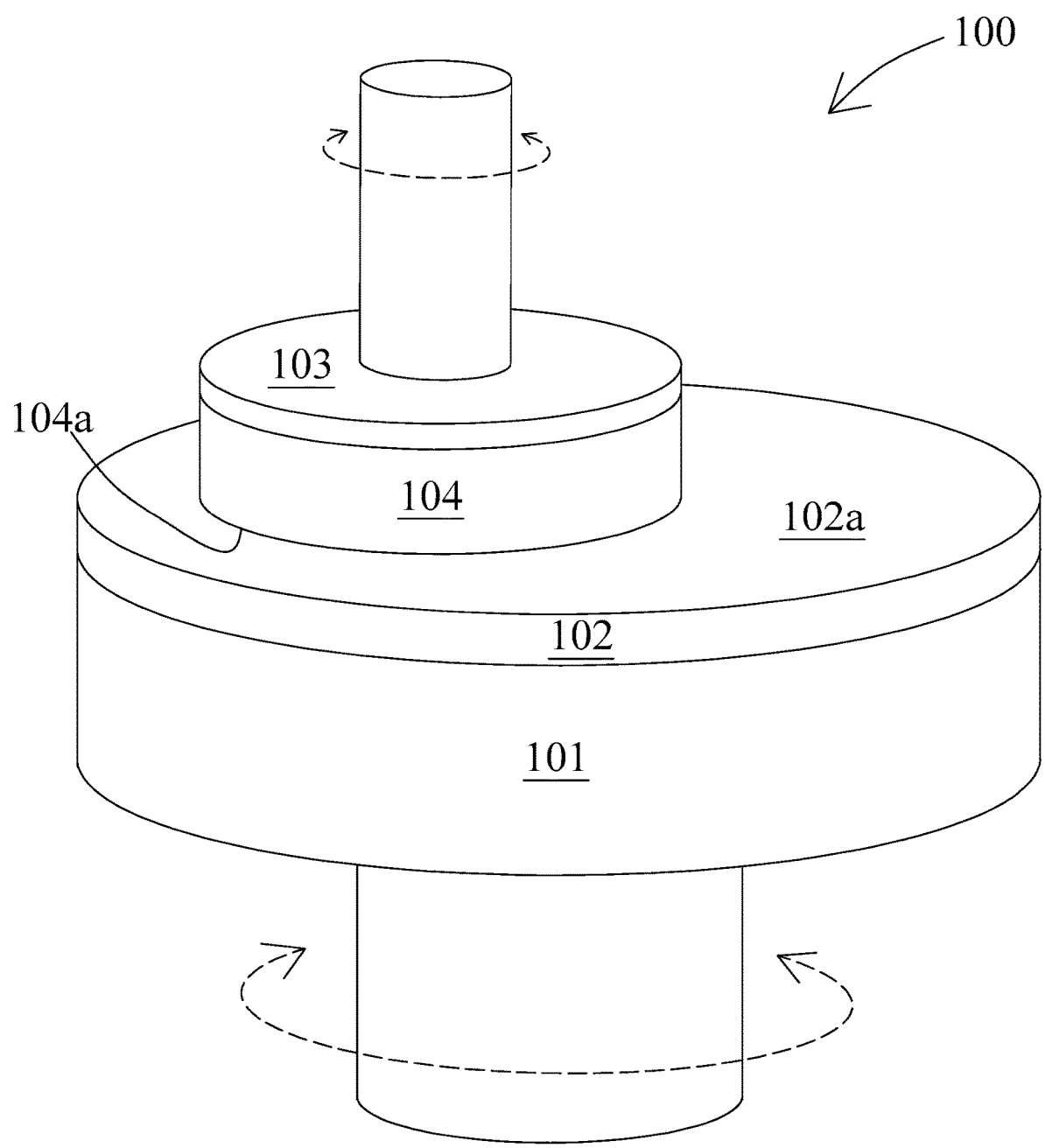

In operation 302, the polishing pad 102 is rubbed to produce polishing pad debris as shown in FIG. 5. In some embodiments, the polishing pad 102 and the stage 101 are rotated upon the rubbing of the polishing pad 102. In some embodiments, the polishing pad 102 and the stage 101 are rotated in same direction. In some embodiments, the polishing pad 102 and the stage 101 are rotated in clockwise or anti-clockwise direction. In some embodiments, the polishing pad debris is produced upon a rotation of the polishing pad 102 or a rotation of the stage 101. In some embodiments, the polishing pad 102 and the polishing pad debris include PU.

In some embodiments, a semiconductor structure 104 and a holder 103 holding the semiconductor structure 104 are provided and disposed over the polishing pad 102 and the stage 101. In some embodiments, the semiconductor structure 104 is disposed above the polishing pad 102. In some embodiments, the polishing pad 102 is rubbed by the semiconductor structure 104 mounted on the holder 103. In some embodiments, the semiconductor structure 104 is a wafer or a substrate. In some embodiments, the semiconductor structure 104 is rotated relative to the polishing pad 102 upon the rubbing of the polishing pad 102. In some embodiments, the polishing pad 102 is rotated relative to the semiconductor structure 104 upon the rubbing of the polishing pad 102. In some embodiments, the rotation of the polishing pad 102 and the rotation of the semiconductor structure 104 are performed separately or simultaneously.

In some embodiments, the rough surface 102a of the polishing pad 102 is rubbed by a surface 104a of the semiconductor structure 104. In some embodiments, the semiconductor structure 104 is polished or ground by the polishing pad 102 upon the rubbing. In some embodiments, the semiconductor structure 104 is in contact with the polishing pad 102 upon the rubbing, the rotation of the semiconductor structure 104, or the rotation of the polishing pad 102. In some embodiments, the rough surface of the polishing pad 102 is in contact with the surface of the semiconductor structure 104 upon the rubbing of the polishing pad 102, the rotation of the semiconductor structure 104, or the rotation of the polishing pad 102. In some embodiments, a force is applied over the semiconductor structure 104 towards the polishing pad 102 upon the rubbing of the polishing pad 102, the rotation of the semiconductor structure 104 or the rotation of the polishing pad 102.

In some embodiments, the semiconductor structure 104 is polished by the polishing pad 102. In some embodiments, debris including the polishing pad debris and semiconductor structure debris is produced upon the rubbing of the semiconductor structure 104 over the polishing pad 102. In some embodiments, a portion of the polishing pad 102 is removed from the polishing pad 102 to produce the polishing pad debris upon the rubbing of the polishing pad 102. In some embodiments, a portion of the rough surface 102a of the polishing pad 102 is removed to produce the polishing pad debris upon the rubbing of the polishing pad 102. In some embodiments, the protrusions of the polishing pad 102 are partially removed to produce the polishing pad debris upon the rubbing of the polishing pad 102. In some embodiments, a thickness of the polishing pad 102 is reduced by the rubbing of the polishing pad 102. In some embodiments, a height of one of the protrusions of the polishing pad 102 is reduced by the rubbing of the polishing pad 102 or the rotation of the semiconductor structure.

In some embodiments, a portion of the semiconductor structure 104 is removed to produce the semiconductor structure debris upon the rubbing of the polishing pad 102 by the semiconductor structure 104 or the polishing of the semiconductor structure 104. In some embodiments, the semiconductor structure debris is produced upon the rotation of the semiconductor structure 104 or the rotation of the polishing pad 102. In some embodiments, the semiconductor structure 104 is planarized by the polishing pad 102. In some embodiments, the holder 103 and the semiconductor structure 104 are in configurations as described above or shown in FIG. 1.

In operation 303, the polishing pad debris is collected. In some embodiments, the debris including the polishing pad debris and the semiconductor structure debris is collected. In some embodiments, the polishing pad debris and the semiconductor structure debris are produced upon the rubbing of the polishing pad 102 (the operation 302) or the polishing of the semiconductor structure 104. In some embodiments, the polishing pad debris is produced from the polishing pad 102, and the semiconductor structure debris is produced from the semiconductor structure 104. In some embodiments, the polishing pad debris generates from a portion of the polishing pad 102, and the semiconductor structure debris generates from a portion of the semiconductor structure 104.

In some embodiments, the debris is cleaned by cleaning operations such as wet cleaning or any other suitable operations in order to remove unwanted material such as the portion of the semiconductor structure, heavy metal or the like from the debris. In some embodiments, the polishing pad debris is cleaned by cleaning operations to remove unwanted material from the polishing pad debris. In some embodiments, the collected polishing pad debris is suitable for recycling after the cleaning operations.

In operation 304, a wood material is provided. In some embodiments, the wood material is crushed into small pieces for subsequent operations.

In operation 305, a force is applied over the wood material and the polishing pad debris to form a composite article 202. In some embodiments, the wood material is mixed with the polishing pad debris produced upon the rubbing of the polishing pad 102 (the operation 302) to form a composite article 202. In some embodiments, the wood material and the polishing pad debris are compressed to form a composite article 202. In some embodiments, a compressive force is applied over the wood material towards the polishing pad debris or applied over the polishing pad debris over the wood material. In some embodiments, the force squeezes the wood material and the polishing pad debris together to form the composite article 202. In some embodiments, the wood material and the polishing pad debris are compressed by the force to become a block or a cube. In some embodiments, the composite article 202 includes the wood material and the polishing pad debris produced upon the rubbing (the operation 302).

In some embodiments, the polishing pad debris is cleaned by suitable cleaning operations prior to the application of the force or the compression of the polishing pad debris and the wood material. In some embodiments, the portion of the semiconductor structure 104 is removed from the debris produced upon the operation 302 by suitable cleaning operations prior to the compression of the wood material and the debris.

Figure 6:
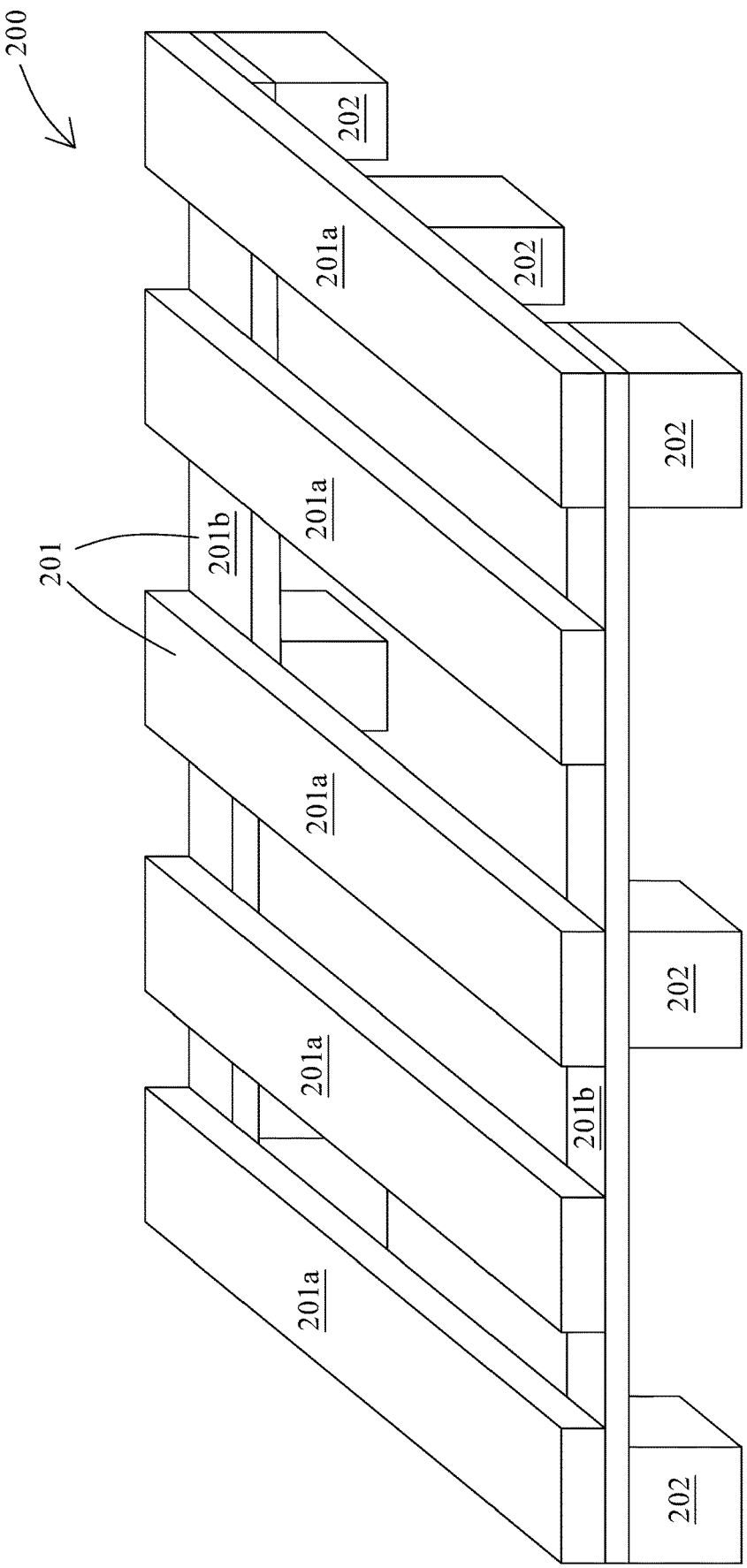

In some embodiments, the composite article 202 is formed after the application of the force over the wood material and the polishing pad debris. In some embodiments, the composite article 202 includes wood and PU. In some embodiments, the composite article 202 is configured as a supportive member of a conveying structure 200. In some embodiments, the composite articles 202 are assembled with several bars 201 to form the conveying structure 200 for transporting goods or the like, as shown in FIG. 6. In some embodiments, the bars 201 includes first bars 201a arranged substantially in parallel to each other and second bars 201b arranged at an edge of the conveying structure 200 and substantially orthogonal to the first bars 201a. In some embodiments, the bars 201 are wooden bars.

In some embodiments, the composite article 202 is attached to an end of one of the bars 201. In some embodiments, the composite article 202 is attached to a corner of the conveying structure 200. In some embodiments, the composite article 202 is a supporting block of the conveying structure 200. In some embodiments, the conveying structure 200 is a pallet for transporting containers, goods or the like. In some embodiments, the bars 201, the composite article or the supporting block 202 and the conveying structure 200 are in configurations as described above or shown in FIG. 2.

In the present disclosure, a method of manufacturing a composite article is disclosed. The method includes providing a polishing pad; rubbing over the polishing pad to produce a polishing pad debris; collecting the polishing pad debris; providing a wood material; and applying a force over the wood material and the polishing pad debris to form the composite article. The polishing pad debris is combined with the wood material to become the composite article, and the composite article is configured to assembly with several wooden bars to become a pallet for transporting goods or the like. As such, the polishing pad debris is recycled or reused. Therefore, the disposal of the polishing pad debris can be reduced or avoided.

In some embodiments, a method of manufacturing a composite article includes rubbing a polishing pad to remove a portion of the polishing pad to produce polishing pad debris; collecting the polishing pad debris; providing a wood material; and applying a force over the wood material and the polishing pad debris to form the composite article, wherein the composite article includes the wood material and the polishing pad debris, and the rubbing of the polishing pad includes removing a portion of the polishing pad to produce the polishing pad debris.

In some embodiments, the rubbing of the polishing pad includes grinding a semiconductor structure by the polishing pad. In some embodiments, the semiconductor structure is a substrate or a wafer. In some embodiments, the polishing pad and the polishing pad debris include polyurethane (PU). In some embodiments, a thickness of the polishing pad is reduced by the rubbing of the polishing pad.

In some embodiments, a first content of the polishing pad debris in the composite article is less than a second content of the wood material in the composite article. In some embodiments, a ratio of the first content to the second content is about 3:7. In some embodiments, the application of the force includes compressing the wood material and the polishing pad debris to form the composite article. In some embodiments, the method further includes assembling the composite article with a plurality of wooden bars to form a pallet. In some embodiments, the composite article is in a block configuration.

In some embodiments, a method of manufacturing a composite article includes providing a polishing pad including a rough surface; providing a semiconductor structure disposed above the polishing pad; contacting the semiconductor structure with the rough surface of the polishing pad; rotating the semiconductor structure relative to the polishing pad; providing a wood material; and compressing the wood material and a debris produced upon the rotation of the semiconductor structure to form the composite article, wherein the debris includes a portion of the polishing pad removed from the polishing pad upon the rotation of the semiconductor structure.

In some embodiments, the rough surface of the polishing pad is in contact with the semiconductor structure upon the rotation of the semiconductor structure. In some embodiments, the polishing pad includes a plurality of protrusions protruded from the rough surface of the polishing pad, and a height of one of the plurality of protrusions is reduced by the rotation of the semiconductor structure. In some embodiments, the method further includes prior to the compression of the wood material and the debris, cleaning the debris to remove a portion of the semiconductor structure debris from the debris, wherein the portion of the semiconductor structure debris is generated from the semiconductor structure upon the rotation of the semiconductor structure.

In some embodiments, the method further includes applying a force over the semiconductor structure towards the polishing pad upon the rotation of the semiconductor structure. In some embodiments, the method further includes rotating the polishing pad relative to the semiconductor structure. In some embodiments, the rotation of the polishing pad and the rotation of the semiconductor structure are performed separately or simultaneously.

In some embodiments, a method of manufacturing a composite article includes providing a polishing pad; providing a semiconductor structure disposed above the polishing pad; polishing the semiconductor structure by the polishing pad; collecting a polishing pad debris produced upon the polishing; providing a wood material; and compressing the wood material and the polishing pad debris to form the composite article, wherein the polishing pad debris includes a portion of the polishing pad removed from the polishing pad upon the polishing.

In some embodiments, the polishing pad debris is cleaned prior to the compression. In some embodiments, the method further includes providing a plurality of wooden bars arranged substantially in parallel to each other; attaching the composite article to an end of one of the plurality of wooden bars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a composite article, comprising:
   providing a polishing pad including a rough surface;
   providing a semiconductor structure disposed above the polishing pad;
   contacting the semiconductor structure with the rough surface of the polishing pad;
   rotating the semiconductor structure relative to the polishing pad to generate a semiconductor structure debris peeled off from the semiconductor structure and a polishing pad debris peeled off from the polishing pad;
   collecting the polishing pad debris generated during the rotation;
   providing a wood material; and
   mixing the collected polishing pad debris with the wood material to form the composite article.

2. The method of claim 1, wherein the semiconductor structure debris includes silicon and is physically separated from the semiconductor structure.

3. The method of claim 1, wherein the semiconductor structure debris and the polishing pad debris are generated simultaneously during the rotation.

4. The method of claim 1, wherein a first amount of the polishing pad debris in the composite article is less than a second amount of the wood material in the composite article.

5. The method of claim 4, wherein a ratio of the first amount to the second amount is about 3:7.

6. The method of claim 1, wherein the polishing pad debris is physically separated from the polishing pad upon the compression.

7. The method of claim 1, wherein the polishing pad is rotated upon the rotation of the semiconductor structure.

* * * * *